United States Patent [19]

Brodie

[11] 4,412,183
[45] Oct. 25, 1983

[54] AC RESISTOR ATTENUATOR AND ASSOCIATED AMPLIFIER CIRCUITS

[76] Inventor: Benjamin T. Brodie, Edmonds, Wash.

[21] Appl. No.: 194,137

[22] Filed: Oct. 6, 1980

[51] Int. Cl.³ .............................................. H03F 1/00
[52] U.S. Cl. ...................................... 330/68; 330/86; 330/156; 338/60; 338/64; 338/205; 338/299; 338/320
[58] Field of Search ............................... 330/65–68, 330/86, 156; 33/81 R; 338/60, 64, 205, 299, 302, 307, 308, 314, 320

[56] References Cited

U.S. PATENT DOCUMENTS

| | | | |
|---|---|---|---|
| 1,038,422 | 9/1912 | Nolan . | |
| 2,075,733 | 3/1937 | Lazarus . | |
| 2,361,405 | 10/1944 | Kopple . | |
| 2,378,873 | 6/1945 | Thompson . | |
| 2,568,600 | 9/1951 | Wirk | 338/60 |
| 2,793,256 | 5/1957 | Taïets | 338/60 X |
| 2,838,639 | 6/1958 | Planer et al. | 338/308 X |
| 3,896,284 | 7/1975 | Holmes | 338/48 |
| 4,079,337 | 3/1978 | Lundgren et al. | 330/307 |
| 4,123,741 | 10/1978 | Kiyono et al. | 338/121 |
| 4,267,634 | 5/1981 | Welland | 338/307 X |

FOREIGN PATENT DOCUMENTS 1246166 9/1971 United Kingdom ............. 333/81 R

OTHER PUBLICATIONS

Edrington, "D-a Converter forms Programmable Gain Control", *Electronics,* Jul. 24, 1975.

*Primary Examiner*—James B. Mullins

[57] ABSTRACT

An AC resistor attenuator with low parasitic capacitance coupling and, thus, a substantially constant attenuation value over a relatively wide frequency range is disclosed. The AC resistor attenuator comprises a first elongate resistor substantially entirely surrounded by a second elongate resistor. The first and second elongate resistors are thermally matched and have a substantially identical resistance profile. The first and second resistors are connected in series. The other ends of the first and second resistors are connected across the source of the signal to be attenuated. The attenuated signal is obtained at the junction between the first and second resistors. Except in the case where fifty percent (50%) attenuation is to be provided, the higher value resistance of the attenuator forms the first resistor and the lower value forms the second resistor. Preferably, the first resistor is a finely distributed thin film resistor on a suitable dielectric substrate; and, the second resistor is formed of two elements, each comprising a finely distributed thin film resistor on a suitable dielectric substrate. The two elements are mounted on opposite sides of the substrate supporting the first resistor. Alternative embodiments include further resistors positioned so as to surround the first and second resistors (and other inner resistors) in the same manner as the second resistor surrounds the first resistor. Regardless of form, the external resistors reduce parasitic capacitive coupling (i.e., coupling to surrounding items) to the inner resistors. As a result, the attenuation value remains the same over a wide frequency range. In addition to being used as a simple AC resistance attenuator, the AC resistor attenuator is also used in feedback and other amplifier systems to provide improved amplifier systems having an amplification value that remains constant over a relatively wide frequency range.

28 Claims, 14 Drawing Figures

AC RESISTOR ATTENUATOR AND ASSOCIATED AMPLIFIER CIRCUITS

TECHNICAL AREA

This invention is directed to resistor networks and, more particularly, to resistor attenuators and amplifier circuits including resistor attenuators.

BACKGROUND OF THE INVENTION

Attenuators are widely used in electronic circuits to reduce the level of signals. For example, attenuators are used to reduce the level of voltages in measuring instruments to prevent overloading, for scaling, etc. In addition, attenuators are used in amplification systems to control the level of the signal to be ammplified and/or the amount of signal feedback. In audio systems, attenuators are used to control the level of the audio signal emitted by the speaker, earphones or other electroacoustic transducer.

The most basic form of an attenuator is two components connected in series across the source of the signal to be attenuated. In a resistance attenuator, the two components are, of course, resistors. In a capacitance attenuator, the two components are capacitors. In some attenuators, both resistors and capacitors are connected together to provide an AC attenuator operable over a relatively wide frequency range.

In the past, one of the problems with resistance attenuators, when utilized to attenuate AC signals, is their frequency nonlinearity. More specifically, as the frequency of the AC signal increases, parasitic capacitive coupling to the resistors forming the attenuator has an increasingly greater effect on the attenuation value of the attenuator. At some point, the attenuation value begins to change significantly with changes in frequency. While combined resistance/capacitance attenuators reduce this problem, even such attenuators have a dip in their attenuation value in the region where the attenuator shifts from a predominantly resistance attenuator to a predominantly capacitance attenuator.

Obviously, an attenuator whose attenuation value changes with frequency is undesirable, particularly in the case of precision equipment, such as AC voltage measuring equipment, wherein the maintenance of the same attenuation value over a wide frequency range is vital if accurate results are to be achieved.

Various proposals have been made to overcome the parasitic capacitive coupling disadvantage of simple resistive attenuators so that they can be utilized as AC attenuators. One proposal comprises shielding the higher value resistor with the same potential at both ends. The difficulty with this method is that it creates a distributed R-C network that is theoretically incorrect. As a result, it is difficult to use this proposal to create useful attenuators. Another proposal is to enclose the entire assembly in a conductive box. While this proposal reduces parasitic capacitive coupling, enough parasitic capacitive coupling remains to prevent the attenuation value from remaining the same over a wide frequency range. Moreover, theoretically, the box must be made infinitely large to work satisfactorily. Where size is a significant factor (as it is in microelectronics), this solution is also unacceptable for this reason. A further alternative is to surround the attenuator with a capacitive divider formed of small capacitors. This proposal has the disadvantages that it significantly reduces input impedance and requires a large capacitance to be effective. Reduction of input impedance creates an undesirable loading of the signal source, and large capacitances are undesirable in microelectronic environments. A still further proposal for maintaining the attenuation value the same over a wide frequency range is to guard the attenuator with an external signal. This proposal is undesirable because it requires that the system have the capability of generating highly accurate AC voltages.

In summary, none of the prior art approaches to forming an AC resistance attenuator suitable for attenuating AC signals by the same amount over a relatively wide frequency range have been satisfactory. Either the prior art techniques have required costly additional circuitry or they have been unduly bulky. The present invention is directed to providing an AC resistor attenuator that has the ability to attenuate AC signals over a relatively wide frequency range without either of these (or other) disadvantages.

It is an object of this invention to provide a new and improved AC resistor attenuator.

It is another object of this invention to provide an AC resistor attenuator having low parasitic capacitive coupling and, thus, a constant attenuation value over a relatively wide frequency range.

In the past, resistor attenuator networks have been used in amplifier systems to control various signal levels, such as the level of the input signal to be amplified or the level of a feedback signal, for examples. Such resistor attenuators have not been as satisfactory or desirable, particularly when the amplifier system is required to amplify signals over a relatively wide frequency range. Again, the difficulty arises because of the parasitic capacitive coupling that occurs between the resistors forming the attenuator and surrounding items. More specifically, as the frequency of the signal to be amplified increases, the effect of parasitic capacitive coupling increases to change the attenuation value of the resistors forming the attenuator. As the attenuation value changes, the amount of signal amplification changes (or, in the case of an input attenuator, the level of the input signal being amplified changes), which is unacceptable in environments where a constant amount of amplification over a wide frequency range is required.

Therefore, it is another object of this invention to provide an amplifier system suitable for amplifying AC signals by a constant amount over a relatively wide frequency range.

It is a still further object of this invention to provide an AC amplifier system including a resistor attenuator with low parasitic capacitive coupling.

SUMMARY OF THE INVENTION

In accordance with this invention, AC resistor attenuators with low parasitic capacitive coupling and, thus, substantially constant attenuation over a relatively wide frequency range are provided. The least complicated embodiment of an AC resistor attenuator formed in accordance with the invention comprises a first elongate resistor substantially entirely surrounded by a second elongate resistor. The second elongate resistor reduces parasitic capacitance coupling to the first elongate resistor. The first and second elongate resistors are thermally matched and have substantially identical resistance profiles. The first and second resistors are connected in series. The other ends of the resistors are connected to terminals suitable for connection across the source of the signal to be attenuated. The junction between the first and second resistors is the output terminal of the attenuator and, thus, is adapted to be connected to the input of the circuit receiving the attenuated signal.

Preferably, the first and second resistors are film resistors formed on a suitable substrate. Thin film resistors in a finely distributed pattern is the most preferred form of film resistors. Also, preferably, the second resistor is formed of two elements positioned on opposite sides of the first resistor so as to form an overall sandwich comprising an inner substrate supporting the first thin film resistor and two outer substrates, each supporting an element of the second thin film resistor. The two outer substrates are positioned, of course, on opposite sides of the inner substrate. In addition, preferably, a dielectric layer is located between the inner substrates and each of the outer substrates. If desired, further resistor layers, each formed of two elements mounted on substrates, can be positioned on opposite sides of the elements forming the second resistor. Thus, each outer resistor substantially entirely surrounds the inner resistors. Regardless of how formed, except in the case of a fifty percent (50%) ratio attenuator, the higher value resistors are always located inwardly of the lower value resistors. In this way, parasitic capacitive coupling is always to the lowest value resistor. Because parasitic capacitive coupling is to the lowest value resistor, its effect is less than it would be if parasitic capacitive coupling were to a higher value resistor.

AC resistor attenuators formed in accordance with the invention can be built in other than sandwich forms. For example, the first and second (and other) elongate resistors can be in the form of coaxially oriented coils separated by low dielectric constant layers. As with the sandwich embodiment of the invention, the elongate coil resistors are thermally matched and have substantially identical resistance profiles.

In accordance with further principles of this invention, amplifier systems incorporating an AC resistor attenuator formed in accordance with the invention are provided. In one form, the AC resistor attenuator is connected in the feedback path of an amplifier, whereby an overall amplifier system having a substantially constant amount of gain over a relatively wide frequency range is provided. More specifically, in one form, one resistor of the AC resistor attenuator formed in accordance with the invention forms the feedback resistor of an amplifier, and the other resistor forms the series input resistor of the amplifer. As a result, the terminals at opposite ends of the series first and second resistors are connected to the input signal terminal and the output terminal of the amplifier system; and, the junction between the first and second resistors is connected to the input of the amplifier. In another form of amplifier system formed in accordance with the invention, an AC resistor attenuator formed in accordance with the invention is connected as a signal divider across the input of an amplifier and reduces the level of the input signal prior to amplification. The amount of reduction is constant over a relatively wide frequency range, when compared to prior art resistor attenuators formed of spaced apart, discrete resistors.

As will be appreciated from the foregoing description, the invention provides new and improved AC resistor attenuators. Because the resistor attenuators are formed such that one resistor surrounds and, thus, in essence shields another resistor, the amount of parasitic capacitance coupling to the internal resistor is substantially reduced. While capacitive coupling between the two resistors exists in an AC resistor attenuator formed in accordance with the invention, such capacitive coupling has substantially no effect on the attenuation value, regardless of frequency changes. Also, while parasitic capacitance coupling to the outer resistor is still present, the total amount of parasitic capacitance coupling is significantly less than it is for a conventional resistor attenuator formed of two separate resistors. Moreover, if the outer resistor is chosen to be the lower of the two (or more) resistors forming the overall attenuator, the effect of parasitic capacitance coupling is further minimized.

Not only does the invention provide AC resistor attenuators that can be utilized as simple AC (or DC) voltage reducing devices, when such attenuators are included in amplifier systems, improved amplifier systems having constant gain values over wide frequency ranges are provided. This result is achieved because maintaining parasitic capacitance coupling low prevents such coupling from significantly effecting amplifier system gain as signal frequency increases.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying drawings wherein.

DESCRIPTION OF THE PREFERRED EMBODIMENT

Figure 1:
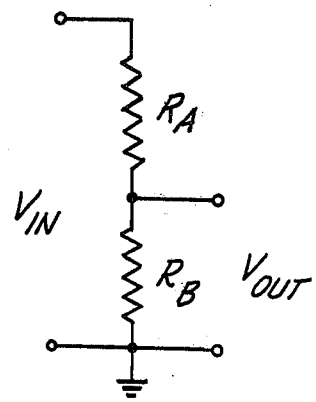
FIG. 1 is a schematic diagram of a prior art simple resistor attenuator.

FIG. 1 is a schematic diagram of a conventional prior art simple resistor attenuator and comprises two physically separated resistors designated $R_A$ and $R_B$ connected in series. The series connection is adapted to be connected across the output of the source producing the signal to be attenuated. The signal to be attenuated is designated $V_{IN}$. The output of the attenuator is taken across $R_B$ and is designated $V_{OUT}$. The ratio between $V_{OUT}$ and $V_{IN}$, is, of course, determined by the ratio of $R_B$ to $R_A + R_B$.

The two resistor attenuator illustrated in FIG. 1 is widely used in the electronic circuits to attenuate DC voltages. It is also utilized in some circuits as a low frequency AC attenuator. The primary disadvantage of the simple resistor attenuator illustrated in FIG. 1 is that it cannot be effectively used in the mid to high frequency range because its attenuation value changes as frequency increases as a result of parasitic capacitance coupling.

Parasitic capacitive coupling is defined for purposes of this description as capacitance coupling between the resistors of the attenuator and surrounding components, as opposed to capacitance coupling between the resistors or across segments of the resistors. The latter resistance is here defined as internal resistance.

At DC and low (generally below 1 kHz) AC frequency ranges, parasitic capacitance coupling has little, if any, effect on the attenuation value of a simple resistor attenuator of the type illustrated in FIG. 1 because the value of parasitic capacitance coupling is usually one microfarad or below. However, as frequency increases, the effect of parasitic capacitance coupling on the attenuation value of a simple resistor attenuator becomes greater and greater. In fact, in the high frequency ranges, capacitor attenuators, not resistor attenuators, are utilized to attenuate signals. The problem with a capacitor attenuator is that while it is less sensitive to the effects of parasitic capacitive coupling, it provides a substantially lower input impedance than a resistor attenuator (and, thus, increased loading). In addition, the temperature stability of a capacitor attenuator is substantially worse than the temperature stability of a resistor attenuator. Furthermore, the capacity itself changes significantly with frequency.

Figure 2:
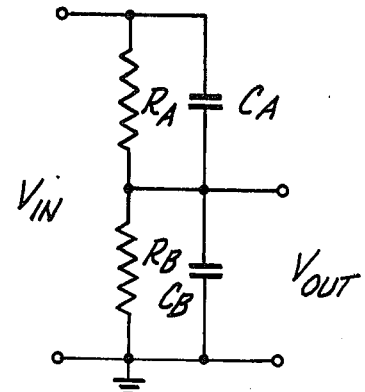
FIG. 2 is a schematic diagram of a prior art simple parallel resistor/capacitor attenuator.

Occasionally, in the past, when attenuation over a relatively wide frequency range is desired, an attenuator of the type illustrated in FIG. 2 is used. FIG. 2 illustrates a parallel resistor/capacitor attenuator that includes a resistor attenuator of the type illustrated in FIG. 1, i.e., an attenuator comprised of two resistors designated $R_A$ and $R_B$, and a capacitor attenuator. The capacitor attenuator comprises two capacitors designated $C_A$ and $C_B$. $C_A$ is connected in parallel with $R_A$ and $C_B$ is connected in parallel with $R_B$. One disadvantage of a parallel resistor/capacitor attenuator, such as that illustrated in FIG. 2, is the dip in the attenuation value curve that occurs in the region where the predominant amount of attenuation shifts from the resistors to the capacitors. That is, the attenuation value of such devices is not constant over the entire frequency range that the attenuator is designed to function over. This disadvantage can be of critical importance, and must be compensated for in some systems.

Figure 3:
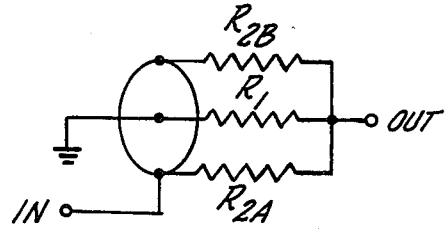
FIG. 3 is a schematic diagram of an AC resistor attenuator formed in accordance with the invention, connected in a particular manner.

FIG. 3 is a schematic diagram of an AC resistor attenuator, formed in accordance with the invention, that overcomes the disadvantages of prior art simple resistor attenuators, such as attenuators of the type illustrated in FIG. 1. The AC resistor attenuator illustrated in FIG. 3 includes two resistors, one of which is formed of two elements. More specifically, FIG. 3 illustrates a first resistor designated $R_1$ and a second resistor formed of two elements designated $R_{2A}$ and $R_{2B}$. $R_{2A}$ and $R_{2B}$ are shown as lying on opposite sides of $R_1$ to signify that the second resistor substantially entirely surrounds the first resistor. Further, $R_{2A}$ and $R_{2B}$ lie parallel to $R_1$; and, as will be better understood from the following description, the resistance profiles of $R_{2A}$ and $R_{2B}$ are similar to the resistance profile of $R_1$. Further, the temperature coefficient of resistivity of $R_1$, $R_{2A}$ and $R_{2B}$ is the same, i.e., $R_1$, $R_{2A}$ and $R_{2B}$ are thermally matched (preferably to 5 ppm/C.°).

One end of $R_1$ is shown in FIG. 3 as connected to a common terminal, e.g., ground. The other end of $R_1$ is connected to the adjacent ends of $R_{2A}$ and $R_{2B}$; and, to the attenuator output terminal denoted OUT. The other ends of $R_{2A}$ and $R_{2B}$ are connected together and to the attenuator input terminal denoted IN.

Figure 4:
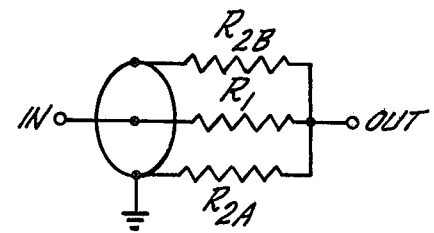
FIG. 4 is a schematic diagram of an AC resistor attenuator of the type illustrated in FIG. 3, connected in a slightly different manner.

FIG. 4 illustrates an AC resistor attenuator formed in accordance with the invention that is identical to the AC resistor attenuator illustrated in FIG. 3, except that the resistors are connected in a different manner to the common, IN and OUT terminals. Thus, the AC resistor attenuator illustrated in FIG. 4 comprises $R_1$ and $R_{2A}$ and $R_{2B}$. However, rather than one end of $R_1$ being connected to the common terminal, e.g., ground, it is connected to IN. The other end of $R_1$ is connected to the adjacent ends of $R_{2A}$ and $R_{2B}$; and, to OUT, as in FIG. 3. The other ends of $R_{2A}$ and $R_{2B}$ are connected together and to the common terminal, e.g., ground. Thus, the common and IN terminals of FIG. 4 are reverse from FIG. 3.

AC resistor attenuators formed in accordance with the invention can be constructed in a variety of manners. For example, the first and second resistors can be thick film resistors mounted on suitable substrates and having their resistivity controlled to provide substantially identical resistance profiles of the desired resistance values. Alternatively, and more preferably, the resistors can be thin film resistors mounted on suitable substrates and having the cross coupling between adjacent resistive paths controlled to provide the desired resistance values and substantially identical resistance profiles. Most preferably, thin film resistor embodiments of the invention have finely distributed patterns, as opposed to relatively coarse distribution patterns. While AC resistor attenuator embodiments of the invention can be formed other than as thick or thin film resistor structures, since finely distributed pattern thin film resistors are presently the most preferred form of the invention, such structures are illustrated in FIGS. 5-7 and hereinafter described.

Figure 5:
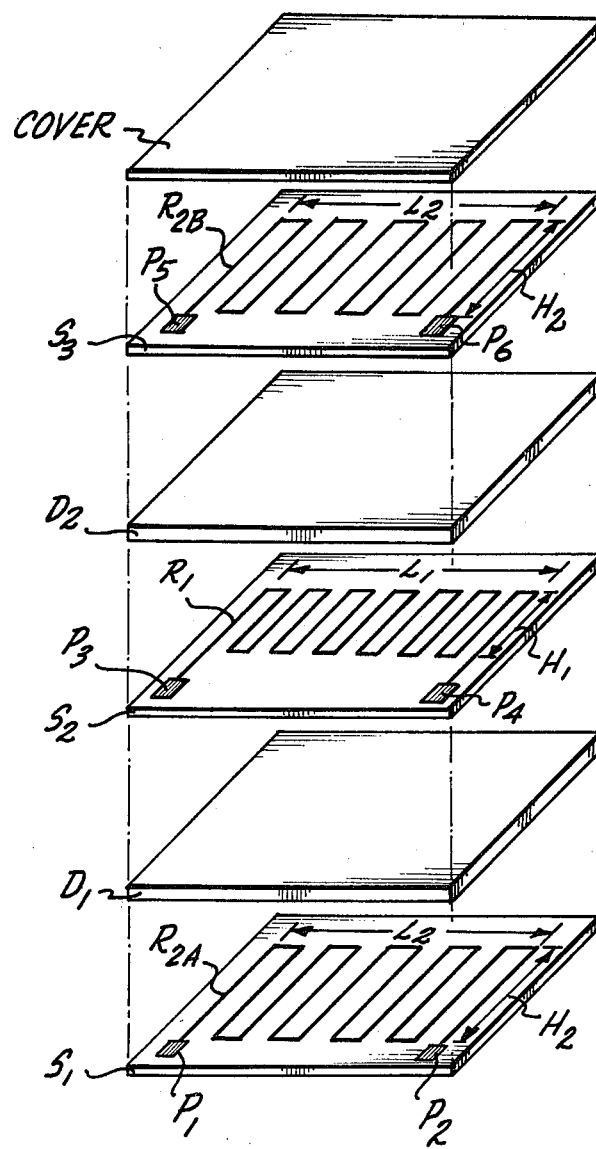
FIG. 5 is a generalized, exploded view of a thin film AC resistor attenuator formed in accordance with the invention.
Figure 6:
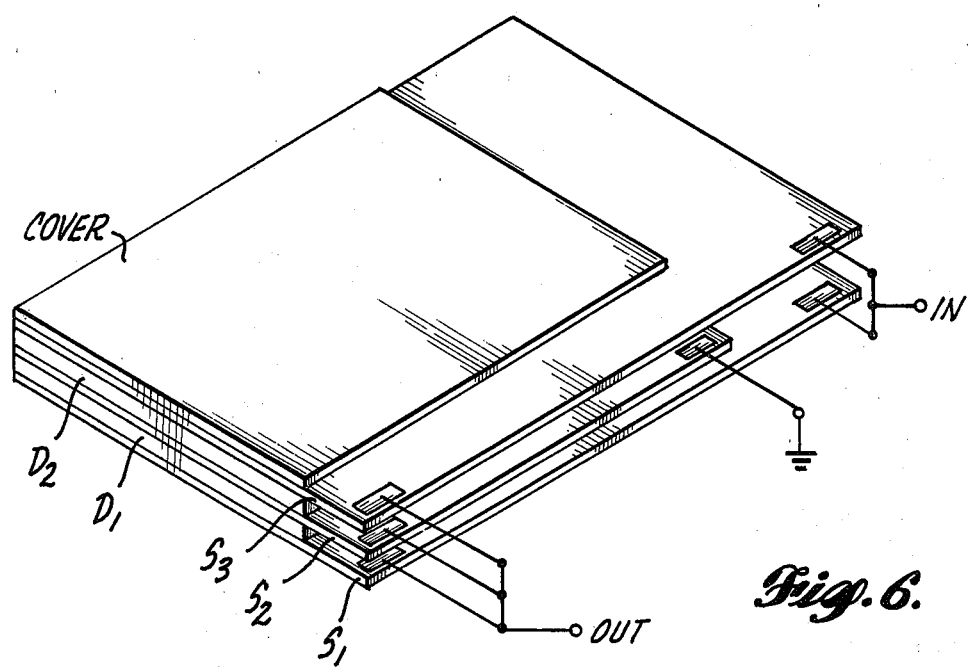
FIG. 6 is a perspective view of one embodiment of a thin film AC resistor attenuator formed in accordance with the invention.
Figure 7:
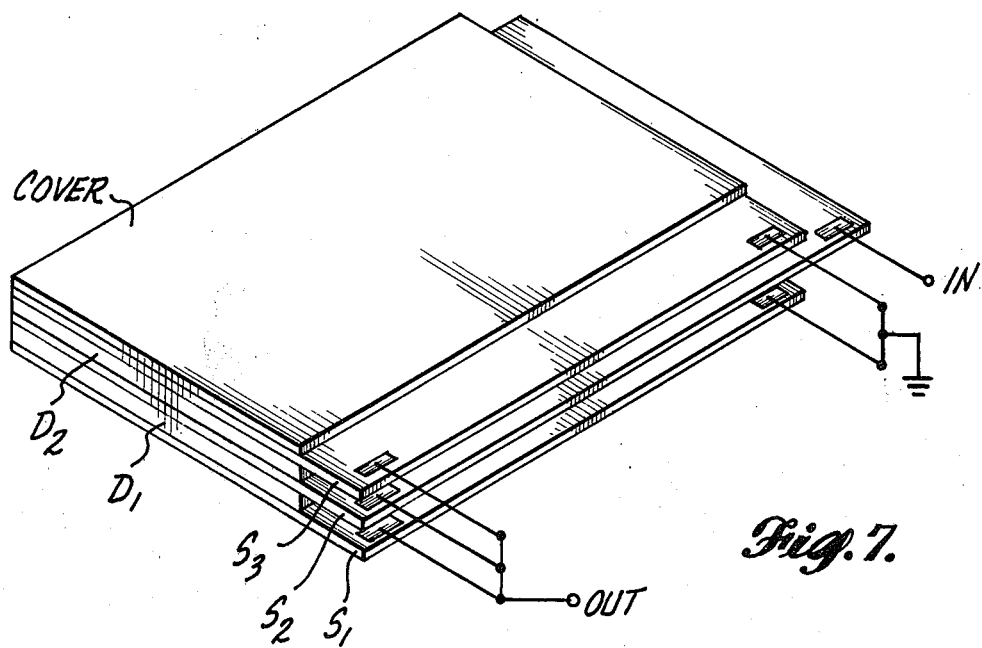
FIG. 7 is a perspective view of an alternate embodiment of a thin film AC resistor attenuator formed in accordance with the invention.

The AC resistor attenuator illustrated in FIGS. 5-7 comprises a sandwich of substrates upon which finely distributed patterns of thin fil resistors are formed, separating low dielectric constant spacers and a cover. Starting at the "bottom" of the sandwich, the first layer comprises a first planar substrate designated $S_1$. Formed on the upper surface of $S_1$ is the $R_{2A}$ element of the second resistor of the AC resistor attenuator. $R_{2A}$ is in the form of a thin film resistor having a finely distributed pattern with length and width dimensions noted $L_2$ and $H_2$, respectively. While the illustrated $R_{2A}$ pattern is zigzag in form, other well-known elongate thin film resistor patterns can be used, if desired. The ends of the $R_{2A}$ element are connected to a pair of terminals designated $P_1$ and $P_2$.

Mounted atop $S_1$ is a first planar spacer formed of a low dielectric constant material, designated $D_1$. Mounted atop $D_1$ is a second planar substrate designated $S_2$. Formed on the upper surface of $S_2$ is $R_1$. $R_1$ is also in the form of a finely distributed pattern. The length and width dimensions of the $R_1$ pattern are denoted $L_1$ and $H_1$. The ends of $R_1$ are connected to a pair of terminals designated $P_3$ and $P_4$. Again, while the illustrated $R_1$ pattern is zigzag in form, other well-known elongate thin film resistor patterns can be used.

Mounted atop $S_2$ is a second planar spacer formed of a low dielectric constant material, designated $D_2$. Mounted atop $D_2$ is a third planar substrate designated $S_3$. Formed on the upper surface of $S_3$ is the $R_{2B}$ element of the second resistor. As with $R_{2A}$, $R_{2B}$ is in the form of a thin film resistor having a finely distributed pattern. The length and width dimensions of the $R_{2B}$ pattern are the same as the length and width dimension of the $R_{2A}$ patterns, namely $L_2$ and $H_2$ respectively. The ends of $R_{2B}$ are connected to a pair of terminals designated $P_5$ and $P_6$. As with the $R_1$ and $R_{2A}$ patterns, the $R_{2B}$ pattern can take a form other than the illustrated zigzag form. A cover is mounted atop $S_3$ to create a symmetrical sandwich structure.

$D_1$ and $D_2$ and $S_1$, $S_2$, $S_3$ and the cover all may be formed of the same low dielectric material such as alumina. $S_1$, $S_2$ and $S_3$ are preferably all formed of the same material to provide good matching of $R_1$, $R_{2A}$ and $R_{2B}$. The cover is formed of the same material so that the overall structure is symmetrical. While the thin film process used to create the actual embodiments described below formed $D_1$ and $D_2$ of alumina, other materials can be used, the primary requirement being that $D_1$ and $D_2$ be formed of a low dielectric constant material in order to reduce the sensitivity of the structure to the physical alignment of the parts. Borosilicate glass appears to be a suitable material that may in fact be better than alumina because of its lower dielectric constant. The thickness of $D_1$ and $D_2$ is a compromise between alignment sensitivity and fringing effects for a given dielectric material.

Preferably, $L_1$ is equal to $L_2$. On the other hand, $H_1$ is not equal to $H_2$. Rather, $H_1$ is substantially less than $H_2$. In other words, $R_1$ is as long as $R_{2A}$ and $R_{2B}$, but substantially narrower. $H_1$ is made substantially less than $H_2$ to reduce edge effects along the length of the AC resistance attenuator. While the width dimensions of $R_{2A}$ and $R_{2B}$ are greater than the width dimension of $R_1$, as will be better understood from the following discussion, the longitudinal resistance profile of $R_1$ is still substantially identical to the longitudinal resistance profiles of $R_{2A}$ and $R_{2B}$.

As will be readily appreciated by those familiar with the formation of thin film resistors, the resistance profile as well as the resistance of $R_1$, $R_{2A}$ and $R_{2B}$ is determined by which of the shorting links cutting across the runs of a zigzag pattern are opened. More specifically, when a zigzag pattern thin film resistor is initially formed, usually every other run is shorted by a shorting link. Because a substantial amount of the total available resistance is shorted, the starting resistance is low. In fact it is lower than the desired resistance. The desired resistance is achieved by cutting the shorting links. Usually, a laser is used to automatically cut the shorting links until the desired resistance value is reached. In accordance with the invention, during the formation of an AC resistor attenuator of the type illustrated in FIG. 5, the same shorting links of $R_{2A}$ and $R_{2B}$ are cut. Thus, $R_{2A}$ and $R_{2B}$ have substantially identical resistance profiles. In addition, the shorting links of $R_1$ are cut so that the resistance profile of $R_1$ is substantially identical to the resistance profiles of $R_{2A}$ and $R_{2B}$. A more complete discussion on the reason for $R_1$, $R_{2A}$ and $R_{2B}$ to have substantially identical resistance profiles is set forth below.

FIGS. 6 and 7 are schematic diagrams showing assembled AC resistor attenuators formed of a plurality of layers of the type illustrated in FIG. 5 and heretofore described. The main difference between FIGS. 6 and 7 is that in FIG. 6, $S_1$ and $S_3$ are substantially longer than $S_2$. Contrariwise, in FIG. 7, $S_2$ is substantially longer than $S_1$ and $S_3$. In both instances, the length difference is to insure adequate spacing between the input and ground terminals when high voltage is present. In the illustrated structures the cover and $D_1$ and $D_2$ are significantly narrower in width than either $S_1$, $S_2$ or $S_3$ and equal in length to the shorter of $S_1$, $S_2$ and $S_3$. This relationship is not critical. All that is required is that $D_1$ and $D_2$ are sized to cover the resistor patterns.

By way of example only, one actual FIG. 6 embodiment of the invention includes: a cover and $D_1$ and $D_2$ having a length dimension of 0.750 inches and a width dimension of 0.575 inches; $S_1$ and $S_3$ have a length dimension of 1.125 inches and a width dimension of 0.687 inches; and, $S_2$ having a length dimension of 0.750 inches and a width dimension of 0.687 inches. The thickness of the cover and $S_1$, $S_2$ and $S_3$ is the same and equals 0.025 inches; and, the thickness of $D_1$ and $D_2$ depends on the amount of additional dielectric desired between the various substrates. Both $D_1$ and $D_2$, $S_1$, $S_2$, $S_3$ and the cover are formed of alumina.

Further, by way of example only, one actual FIG. 7 embodiment of the invention has: a cover and $D_1$ and $D_2$ length dimension of 0.900 inches and width dimension of 0.450 inches; $S_1$ and $S_3$ length dimension of 0.900 inches and width dimension of 0.550 inches; and, $S_2$ length dimension of 1.200 inches and width dimension of 0.550 inches. Again, the cover and $S_1$, $S_2$, and $S_3$ are 0.025 inches thick; and, the thickness of $D_1$ and $D_2$ vary in accordance with the desired amount of additional dielectric between the substrates. Further, the cover, $D_1$, $D_2$, $S_1$, $S_2$ and $S_3$ are all formed of alumina.

As will be readily appreciated from the foregoing description of FIGS. 5-7, the second resistor, formed by elements $R_{2A}$ and $R_{2B}$, surrounds the first resistor $R_1$. Further, the longitudinal resistance profiles of $R_1$, $R_{2A}$ and $R_{2B}$ are substantially identical. Moreover, the temperature coefficient of resistivity of $R_1$, $R_{2A}$ and $R_{2B}$ is the same, i.e., $R_1$, $R_{2A}$ and $R_{2B}$ are thermally matched.

Figure 8:
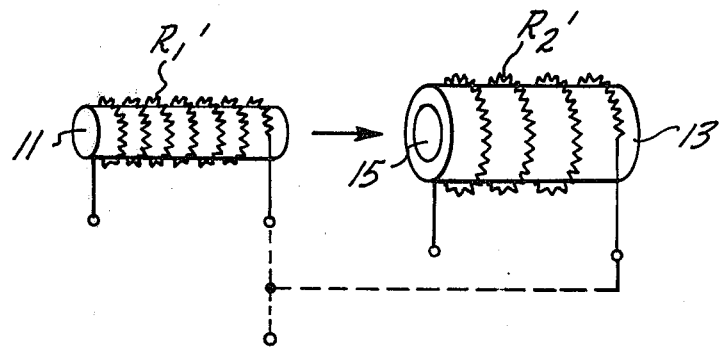
FIG. 8 is a pictorial diagram of an alternate form of an AC resistor attenuator formed in accordance with the invention.

FIG. 8 is an isometric view of an alternative embodiment of an AC resistor attenuator formed in accordance with the invention. The AC resistor attenuator illustrated in FIG. 8 includes a first coiled resistor $R'_1$ and a second coiled resistor $R'_2$. The first coiled resistor $R'_1$ is wound around a suitable cylindrical substrate 11. The second coiled resistor $R'_2$ is wound around a tubular substrate 13. The tubular substrate includes a central aperture 15 which is sized to receive the cylindrical coil form 11 and the first coiled resistor $R'_1$. The length of the first and second coiled resistors $R'_1$ and $R'_2$ is substantially identical, whereby the second coiled resistor $R'_2$ surrounds the first coiled resistor $R'_1$, when the resistors are coaxially mounted and aligned. As with the previously described embodiments of the invention, the temperature coefficient of resistivity of the first and second coiled resistors $R'_1$ and $R'_2$ are the same. Moreover, the resistance profile along the length of the resistors is substantially identical. Finally, one of the adjacent ends of the first and second coiled resistors are connected together as illustrated by the dotted line, whereby the resistors are connected in series. The junction is connected to an output terminal, one of the two ends of the series connection is common and the other end is connected to an input terminal.

Figure 9:
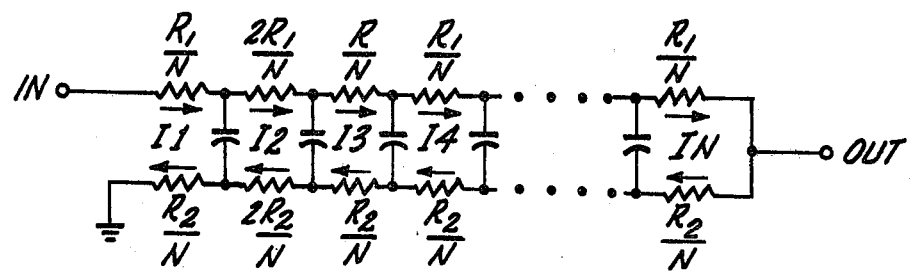
FIG. 9 is a schematic diagram illustrating the distributed capacitance of an AC resistor attenuator formed in accordance with the invention.

Turning now to a mathematical discussion of the reason why the internal capacitance between the first and second resistors has no significant effect on the attenuation value of AC resistor attenuators formed in accordance with the invention, provided the resistance profile of the resistors forming the attenuator are substantially identical. In this regard, FIG. 9 is a schematic diagram illustrating the first and second resistors broken up into resistance segments of equal length. In the case of the first resistor, each resistance segment is designated $R_1/N$, except for the second (from the left) resistance segment, which is designated $2R_1/N$. This designation, of course, indicates that the resistance per unit length for this segment is twice the resistance per unit length of the other segments. Obviously, this illustration is only exemplary because the resistance segments could have any variable relationship and change from segment to segment. As discussed above, it is only important that the resistance profiles of the two resistors be similar. In this regard, each resistance segment of the second resistor is designated as $R_2/N$, except for the second segment (from the left), which is designated $2R_2/N$. Consequently, the resistance profile of the second resistor is identical to the resistance profile of the first resistor. The capacitance between the resistor segments is denoted by the center capacitors illustrated in FIG. 9.

If it is assumed that the input impedance of the device to which the OUT terminal of the resistance attenuator is connected is high, substantially no current is drawn by the device. This is true even though the resistance distribution of the resistors is nonuniform, but substantially identical. As a result, using the segmented resistance nomenclature illustrated in FIG. 9, the input voltage of an AC resistor attenuator formed in accordance with the invention can be defined by the following equation:

$$V_{IN} = I_1 \frac{R_1}{N} + I_2 \frac{2R_1}{N} + I_3 \frac{R_1}{N} + I_4 \frac{R_1}{N} + \ldots I_N \frac{R_1}{N} + \tag{1}$$

$$I_1 \frac{R_2}{N} + I_2 \frac{2R_2}{N} + I_3 \frac{R_2}{N} + I_4 \frac{R_2}{N} + \ldots I_N \frac{R_2}{N}$$

where $I_1$, $I_2$, etc. are the currents flowing in the individual segments of the resistors, as illustrated in FIG. 9.

Equation (1) can be reduced to the following form:

$$V_{IN} = \frac{R_1(N+1)}{N}\left(\sum_{n=1}^{N} I_n\right) + \frac{R_2(N+1)}{N}\left(\sum_{n=1}^{N} I_n\right) \tag{2}$$

which can be further reduced to the following form:

$$V_{IN} = \left[\frac{R_1(N+1)}{N} + \frac{R_2(N+1)}{N}\right] \sum_{n=1}^{N} I_n \tag{3}$$

which can be still further reduced to the following form:

$$V_{IN} = (R_1 + R_2)\left(\frac{N+1}{N}\right) \sum_{n=1}^{N} I_n \tag{4}$$

The output voltage, $V_{OUT}$ is defined by the following equation:

$$V_{OUT} = I_1 \frac{R_2}{N} + I_2 \frac{2R_2}{N} + I_3 \frac{R_2}{N} + I_4 \frac{R_2}{N} + \ldots I_N \frac{R_2}{N} \tag{5}$$

which can be reduced to the following form:

$$V_{OUT} = R_2\left(\frac{N+1}{N}\right) \sum_{n=1}^{N} I_n \tag{6}$$

The attenuation value of any attenuator is, of course, the ratio of its output to its input, in this case $V_{OUT}$ to $V_{IN}$. Based on Equations (4) and (6), the ratio of $V_{OUT}$ to $V_{IN}$ produces the following equation:

$$\frac{V_{OUT}}{V_{IN}} = \frac{R_2\left(\frac{N+1}{N}\right) \sum_{n=1}^{N} I_n}{(R_1 + R_2)\left(\frac{N+1}{N}\right) \sum_{n=1}^{N} I_n} \tag{7}$$

Cancellation of terms reduces Equation (6) to the following form:

$$\frac{V_{OUT}}{V_{IN}} = \frac{R_2}{R_1 + R_2} \tag{8}$$

The foregoing mathematical discussion establishes that the ratio of $V_{OUT}$ to $V_{IN}$, i.e., the attenuation value of an AC resistance attenuator formed in accordance with this invention, is independent of its internal capacity. This result is established to be true regardless of whether or not the resistance profile of the attenuator resistors is uniform or nonuniform, as long as the resistance profiles of the resistors is substantially identical.

Figure 10:
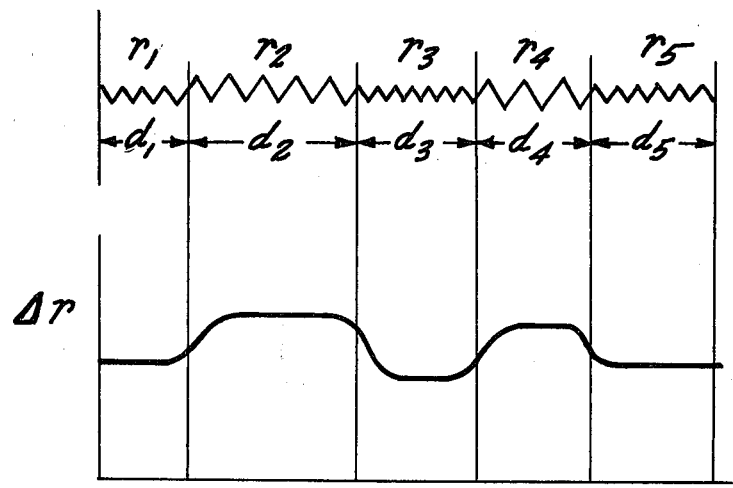
FIG. 10 is a waveform diagram showing a longitudinally changing resistance profile.

By way of example only, FIG. 10 illustrates how resistance can vary along the length of a resistor, i.e., FIG. 10 is an exemplary illustration of a resistance profile. More specifically, the upper portion of FIG. 10 is a diagram of a resistor broken into a plurality of segments each having a different resistance value denoted $r_1$, $r_2$, $r_3$, etc., which are not necessarily of equal length, as denoted by the related length dimensions $d_1$, $d_2$, $d_3$, $d_4$, etc. Located below the resistor diagram is a Cartesian coordinate resistance profile diagram illustrating the incremental resistance value, Δr, along the length D of the resistor.

The previously described AC resistor attenuators formed in accordance with the invention comprise two resistors. When in the form of a sandwich of resistance films mounted on suitable substrates one of the resistors is formed of two elements. It is to be understood, however, that more than two resistors can be used to form an AC resistor attenuator in accordance with the invention. In this regard, attention is directed to FIG. 11 and the following discussion.

Figure 11:
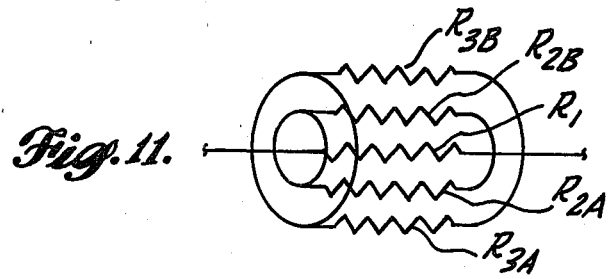
FIG. 11 is a schematic diagram of a further form of an AC resistor attenuator formed in accordance with the invention.

FIG. 11 is a schematic diagram of an AC resistor attenuator formed in accordance with the invention comprising three resistors, rather than two resistors. The second and third resistors are each formed of two elements designated $R_{2A}$ and $R_{2B}$ and $R_{3A}$ and $R_{3B}$, respectively. The other resistor, designated $R_1$, is a single element resistor and is located in the center of the AC resistor attenuator. The second resistor formed of elements $R_{2A}$ and $R_{2B}$ substantially entirely surrounds $R_1$. Thus, $R_1$, $R_{2A}$ and $R_{2B}$ are positioned the same as they were in previously described embodiments of AC resistor attenuators formed in accordance with the invention.

The third resistor, formed of elements $R_{3A}$ and $R_{3B}$, substantially entirely surrounds the second resistor, formed of elements $R_{2A}$ and $R_{2B}$ and, thus, also surrounds the first resistor $R_1$. Assuming the resistance values of the first, second and third resistors are all different, preferably, $R_1$ has the highest resistance value, $R_2$ has the next highest resistance value and $R_3$ has the lowest resistance value. An AC resistor attenuator of the type illustrated in FIG. 11 is readily constructed in the manner illustrated in FIGS. 5-7 and previously described by adding additional layers to the sandwich structure. Or, a FIG. 11 type AC resistor attenuator can be formed in the manner illustrated in FIG. 8 by coaxially mounting an additional coiled resistor to the exterior of the FIG. 8 structure.

Figure 13:
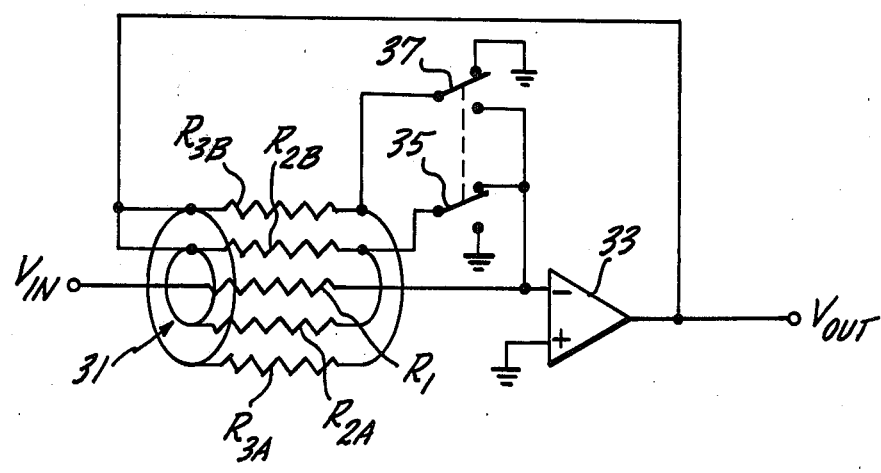
FIG. 13 is a schematic diagram of an alternate embodiment of a step variable gain feedback amplifier system including an AC resistor attenuator formed in accordance with the invention; and, FIG. 14 is a schematic diagram of another form of amplifier system including an AC resistance attenuator formed in accordance with the invention.
Figure 14:
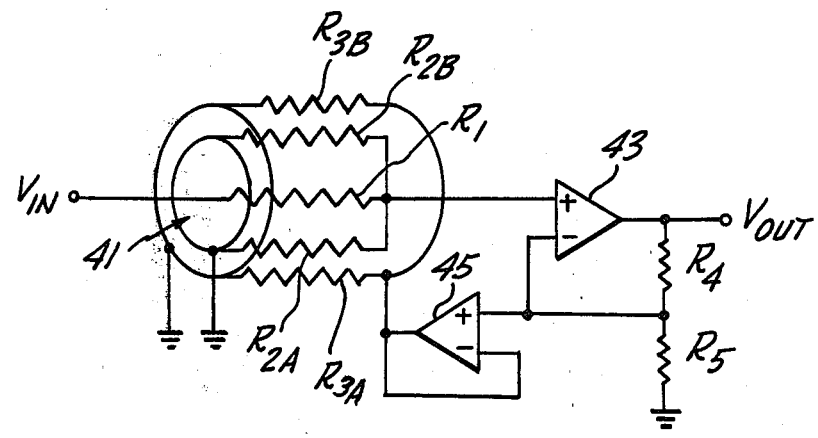

The resistors illustrated in FIG. 11 are not shown as connected together in any particular manner because they can be connected together in various ways, some of which are illustrated in FIGS. 13, 14 and 15 and hereinafter described. In this regard, when used as a simple AC resistor attenuator, the FIG. 11 resistors are connected in series with one end of $R_1$ being connected to the adjacent ends of $R_{2A}$ and $R_{2B}$ at one end and the other ends of $R_{2A}$ and $R_{2B}$ connected to the adjacent ends of $R_{3A}$ and $R_{3B}$. The signal to be attenuated is applied across the series resistors and the output or attenuated signal is taken across either one of the resistors or two adjacent resistors, or any one or more combinations of such single or adjacent pairs of resistors, as required by the circuit with which the attenuator is being used. As with the previously described two resistor AC attenuators formed in accordance with the invention, the temperature coefficients of $R_1$, $R_{2A}$ and $R_{2B}$, and $R_{3A}$ and $R_{3B}$ are the same. In addition, the longitudinal resistance profiles of $R_1$, $R_{2A}$, $R_{2B}$, $R_{3A}$, and $R_{3B}$ are substantially identical. Obviously, AC resistor attenuators formed in accordance with the invention can be formed in the manner illustrated in FIG. 11 and just described from more than three resistors, if desired.

As discussed above, AC resistor attenuators formed in accordance with the invention can be used as simple voltage reducing attenuators. In addition, AC resistor attenuators formed in accordance with the invention can be used with amplifiers to provide improved amplifier systems. More specifically, the amplifier systems formed in accordance with the invention are less effected by parasitic capacitive coupling over a considerably wider frequency range than are prior art amplifier systems using discrete, separated resistor networks to attenuate feedback or input signals. Examples of amplifier systems formed in accordance with the invention are illustrated in FIGS. 12-15 and next described.

Figure 12:
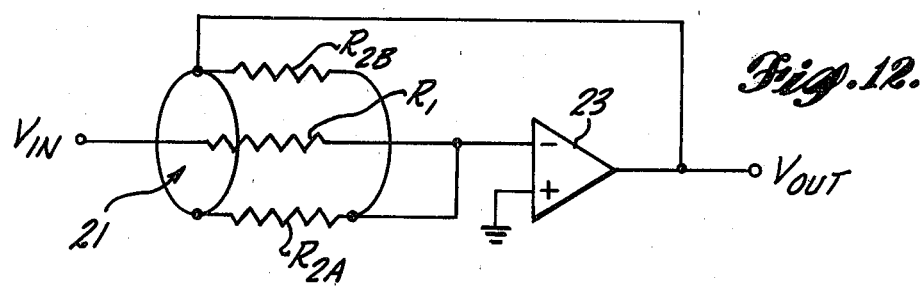
FIG. 12 is a schematic diagram of a constant gain feedback amplifier system including an AC resistor attenuator formed in accordance with the invention.

FIG. 12 illustrates a feedback amplifier system that comprises an AC resistor attenuator 21, formed in accordance with the invention; and, an operational amplifier 23. The AC resistor attenuator 21 is of the type illustrated in FIGS. 3 and 4; that is, the AC resistor attenuator includes a first resistor $R_1$ and a second resistor formed of two elements $R_{2A}$ and $R_{2B}$. One of the adjacent ends of $R_1$ and $R_{2A}$ and $R_{2B}$ are connected together. The other end of $R_1$ is connected to an input terminal that receives the input signal, $V_{IN}$. The junction between $R_1$ and $R_{2A}$ and $R_{2B}$ is connected to the inverting input of the operational amplifier 23. The noninverting input is connected to ground. The output of the operational amplifier 23 is connected to the other end of $R_{2A}$ and $R_{2B}$. Thus, the AC resistor attenuator forms a resistance divider connected between the signal input terminal and the output of the operational amplifier. The junction between the two resistors is connected to the inverting input of the operational amplifier. Thus, $R_{2A}$ and $R_{2B}$ form the feedback resistor of the amplifier system; and, $R_1$ forms the input resistor. The AC resistor attenuator 21 functions in the same manner as the feedback and input resistors have functioned in the past to control the gain of the amplifier system. The only difference is that amplifier system gain remains constant over a substantially greater frequency range, because parasitic capacitance coupling between the feedback resistors, $R_{2A}$ and $R_{2B}$, and adjacent items is substantially reduced.

FIG. 13 is an example of a feedback amplifier system including an AC resistor attenuator 31 of the type illustrated in FIG. 11. More specifically, FIG. 13 includes an AC resistor attenuator 31 of the type illustrated in FIG. 11; an operational amplifier 33; and, first and second single pole-double throw switches 35 and 37. The first and second switches 35 and 37 are ganged together.

The signal input terminal, $V_{IN}$, is connected to one end of $R_1$. The other end of $R_1$ is connected to the inverting terminal of the operational amplifier 33 and to one of the remote terminals of each of the first and second switches 35 and 37. The other remote terminals of the first and second switches are connected to ground. The terminals to which the other end of $R_1$ is connected are such that when the ganged first and second switches are in one position the common terminal of one of the switches is connected to $R_1$ and the common terminal of the other switch is connected to ground and vice versa when the first and second switches are in their other position.

The common terminal of the first switch 35 is connected to one end of the second resistor, formed by elements $R_{2A}$ and $R_{2B}$. The end connection is the same as the end of $R_1$ connected to the inverting input of the operational amplifier 33. Similarly, the common terminal of the second switch 37 is connected to one end of the third resistor, formed by elements $R_{3A}$ and $R_{3B}$. Again, the end connection is the same as the end of $R_1$ connected to the inverting input of the operational amplifier 33. The other end of the second and third resistors are connected together and to the output of the operational amplifier 33. The output of the operational amplifier 33 also is connected to the output terminal, $V_{OUT}$. Finally, the noninverting input of the operational amplifier 33 is connected to ground.

Depending upon the state of the first and second ganged switches 35 and 37, either the second or the third resistor forms a feedback path for the operational amplifier 33. The ratio of the feedback resistor value to the value of $R_1$ determines the amount of gain of the overall amplifier system. Due to the inclusion of an AC resistor attenuator of the type provided by the invention, the gain level remains relatively constant over a wide frequency range. This result occurs because the parasitic capacitive coupling to an AC resistor attenuator formed in accordance with the invention is substantially less than the parasitic capacitive coupling to discrete resistors utilized in a conventional manner to control the gain of a feedback amplifier system.

FIG. 14 illustrates another type of improved amplifier system including an AC resistor attenuator formed in accordance with the present invention. In the amplifier system illustrated in FIG. 14, rather than being connected in the feedback path of an amplifier, the AC resistor attenuator is connected in circuit with a guard amplifier to prevent parasitic capacitive coupling from having any significant effect whatsoever on the attenuation value of the AC resistor attenuator. More specifically, FIG. 14 includes: an AC resistor attenuator 41 of the type illustrated in FIG. 11; first and second operational amplifiers 43 and 45; and, a pair of resistors designated $R_4$ and $R_5$. The input terminal, $V_{IN}$, is connected to one end of $R_1$. The other ends of $R_1$ is connected to the noninverting input of the first operational amplifier 43. The same end of $R_1$ is connected to the adjacent ends of the two elements $R_{2A}$ and $R_{2B}$ that form the second resistor. The other ends of $R_{2A}$ and $R_{2B}$ are connected to ground. The output of the first operational amplifier 43 is connected to the output terminal, $V_{OUT}$, and through $R_4$ in series with $R_5$ to ground. The junction between $R_4$ and $R_5$ is connected to the inverting input of the first operational amplifier 43 and to the noninverting input of the second operational amplifier 45. The output of the second operational amplifier 45 is connected to its inverting input and to the end of the two elements $R_{3A}$ and $R_{3B}$ that form the third resistor, adjacent to the ends of $R_{2A}$ and $R_{2B}$ connected to $R_1$. The other end of $R_{3A}$ and $R_{3B}$ are connected to ground. It should be noted that $R_4$ and $R_5$ are not shown as formed in a sandwich or other configuration in accordance with the invention, since the normal resistance value of $R_4$ and $R_5$ will be so low that parasitic capacitive coupling will be of little or no effect. However, obviously, $R_4$ and $R_5$ could be formed in the manner heretofor illustrated and described, if desired, to further improve the response of the overall amplifier system.

As will be readily appreciated from the foregoing description the first and second resistors $R_1$ and $R_{2A}$, $R_{2B}$ form a voltage divider that attenuates the input signal by a predetermined amount prior to the signal being applied to the first operational amplifier 43. In addition, the output of the first operational amplifier is applied in a feedback manner to the third resistor $R_{3A}$, $R_{3B}$ to create, in essence, a capacitive coupling shield around the first and second resistors. As a result, parasitic capacitive coupling has essentially no effect on the operation of the part of the AC resistor attenuator forming the voltage divider.

As will be readily appreciated from the foregoing description the invention provides a new and improved AC resistor attenuator and improved amplifier systems that include the attenuator. The AC resistor attenuator of the invention has substantially constant attenuation over a relatively wide frequency range, particularly when compared with prior art attenuators made up of two discrete, spaced apart resistors. Further, the invention accomplishes this result without requiring an unduly large structure, or the inclusion of complicated peripheral circuits adapted to prevent capacitive coupling from having an effect on the operation of the attenuator. Not only is the invention useful as a simple attenuator, it is also useful in providing new amplifier systems having a gain value that remains constant over a wide frequency range.

While preferred embodiments of the invention have been illustrated and described, it will be appreciated that various changes can be made therein without departing from the spirit and scope of the invention. For example, in some thin film embodiments of AC resistor attenuators formed in accordance with the invention the additional dielectric layers $D_1$ and $D_2$ illustrated in FIGS. 5-7 may be left out, if the substrate dielectric properties are adequate. Consequently, the invention can be practiced otherwise than as specifically described herein.

The embodiments of the invention in which an exclusive property or privilege is claimed are defined as follows:

1. An AC resistor attenuator with low parasitic capacitance coupling to surrounding items and, thus, substantially constant attenuation over a relatively wide frequency range, said AC resistor attenuator comprising:

a first resistor;

a second resistor substantially entirely surrounding said first resistor for reducing parasitic capacitance coupling to said first resistor;

said first and second resistors being thermally matched and having substantially identical resistance profiles;

electrical connecting means for connecting said first and second resistors in series;

input terminal means connected to one end of said series connected first and second resistors;

output terminal means connected to the junction between said series connected first and second resistors; and common terminal means connected to the other end of said series connected first and second resistors, including a dielectric layer mounted between said first and second resistors, wherein said second resistor comprises first and second elements, said elements mounted on opposite sides of said first resistor, including a first planar substrate, said first resistor mounted on said first planar substrate;

a second planar substrate, said first element of said second resistor mounted on said second planar substrate; and a third planar substrate, said second element of said second resistor mounted on said third planar substrate.

2. An AC resistor attenuator as claimed in claim 1 wherein said first, second and third substrates are formed of a dielectric material.

3. An AC resistor attenuator as claimed in claim 2 wherein said first planar substrate is mounted atop said second planar substrate and wherein said third planar substrate is mounted atop said first planar substrate, whereby said first, second and third planar substrates form a sandwich structure.

4. An AC resistor attenuator as claimed in claim 3 wherein said first resistor and said first and second elements forming said second resistor are thin film resistors.

5. An AC resistor attenuator as claimed in claim 4 wherein said thin film resistors have a finely distributed pattern.

6. An AC resistor attenuator with low parasitic capacitance coupling to surrounding items and, thus, substantially constant attenuation over a relatively wide frequency range, said AC resistor attenuator comprising:
a first resistive means;
a second resistive means substantially entirely surrounding said first resistive means for reducing parasitic capacitance coupling to said first resistive means;
the resistive profile of said first and second resistive means being substantially identical;
said first and second resistive means being thermally matched;
dielectric means mounted between said first and second resistive means;
electrical connecting means for connecting said first and second resistive means in series;
input terminal means connected to one end of said series connected first and second resistive means;
output terminal means connected to the junction between said series connected first and second resistive means; and
common terminal means connected to the other end of said series connected first and second resistive means, wherein said first resistive means comprises a first planar substrate and a first resistive pattern formed on one surface of said first planar substrate; and
said second resistive means comprises second and third planar substrates and second and third resistive patterns, said second resistive pattern formed on one surface of said second planar substrate and said third resistive pattern formed on one surface of said third planar substrate said second and third planar substrates and associated resistive patterns being located on opposite sides of said first planar substrate.

7. An AC resistor attenuator as claimed in claim 6 wherein said first and second resistive patterns are thin film resistive patterns.

8. An AC resistor attenuator as claimed in claim 7 wherein said thin film resistive patterns are finely distributed patterns.

9. An AC resistor attenuator as claimed in claim 8 wherein said dielectric means includes said first, second and third substrates.

10. An AC resistor attenuator as claimed in claim 9 wherein said dielectric means also includes first and second planar layers of low dielectric constant material, said first low dielectric constant planar layer being mounted between said first planar substrate and said second planar substrate and said second low dielectric constant planar layer being mounted between said third planar substrate and said first planar substrate, whereby said first, second and third planar substrates and said first and second low dielectric constant planar layers form a sandwich structure.

11. An AC resistor attenuator as claimed in claim 6 including third resistive means substantially entirely surrounding said second resistive means for reducing parasitic capacitance coupling to said second resistive means, the resistance profile of said third resistive means being substantially identical to the resistance profile of said first and second resistive means, said third resistive means being thermally matched to said first and second resistive means.

12. An AC resistor attenuator as claimed in claim 11 including further electrical connecting means for connecting said third resistive means in circuit with said first and second resistive means.

13. An AC resistor attenuator as claimed in claim 11 wherein:
said second resistive means comprises first and second elements, said elements mounted on opposite sides of said first resistive means; and,
said third resistive means comprises first and second elements, said elements mounted on opposite sides of said second resistive means.

14. An amplifier system having substantially constant gain over a relatively wide frequency range, said amplifier system comprising:
an amplifier;
an AC resistor attenuator including a first resistor and a second resistor, said second resistor substantially entirely surrounding said first resistor, the resistance profiles of said first and second resistor being substantially identical and said first and second resistors being thermally matched; and
electrical connecting means for connecting one end of said first resistor to an input terminal adapted to receive the signal to be amplified by said amplifier system, the other end of said first and one end of said second resistors together and to the input of the amplifier, and the other end of said second resistor to the output of said amplifier, wherein said AC resistor attenuator also includes a third resistor substantially entirely surrounding said second resistor and including a pair of single pole-double throw switches, one of the remote terminals of each of said pair of single pole-double throw switches being connected to ground and the other remote terminals being connected together and to the input of said amplifier, the common terminal of one of said switches connected to said second resistor and the common terminal of the other of said switches connected to said third resistor.

15. An amplifier system as claimed in claim 14 wherein said AC resistor attenuator is a sandwich formed of film resistors mounted on substrates having a low dielectric constant.

16. An amplifier system as claimed in claim 14 wherein said second resistor of said AC resistor attenuator includes first and second elements mounted on opposite sides of said first resistor.

17. An amplifier system as claimed in claim 16 wherein said first resistor and said first and second elements forming said second resistor are thin film resistors.

18. An amplifier system as claimed in claim 17 wherein said thin film resistors have finely distributed patterns.

19. An amplifier system as claimed in claim 14 wherein said amplifier is an operational amplifier having its inverting input connected to said first resistor and its noninverting input connected to ground.

20. An amplifier system as claimed in claim 14 wherein said pair of single pole-double throw switches are ganged together such that when one of said switches is connecting its common terminal to ground the other of said switches is connecting its common terminal to the input of said amplifier.

21. An amplifier system as claimed in claim 20 wherein:
said second resistor of said AC resistor attenuator includes first and second elements mounted on opposite sides of said first resistor; and,
said third resistor of said AC resistor attenuator includes first and second elements mounted on opposite sides of said second resistor.

22. An amplifier system comprising:
an AC resistor attenuator comprising first, second and third resistors, said first resistor substantially entirely surrounding said second resistor and said third resistor substantially entirely surrounding said second resistor, said first, second and third resistors having substantially identical resistance profiles and being thermally matched;
first and second amplifiers;
a pair of resistors connected in series; and,
electrical connecting means for: connecting one end of said first resistor to an input terminal and the other end of said first resistor to the adjacent end of said second resistor and to the input of said first amplifier; connecting the output of said first amplifier to one end of said pair of resistors and the other end of said pair of resistors to ground; connecting the junction between said pair of resistors to the input of said second amplifier; connecting the output of said second amplifier to said third resistor; and, connecting the other end of said third resistor to ground.

23. The amplifier system claimed in claim 22 wherein said second resistor is formed of two elements mounted on opposite sides of said first resistor and said third resistor is formed of two elements mounted on opposite sides of said second resistor.

24. An amplifier system as claimed in claim 22 wherein said first and second amplifiers are operational amplifiers and wherein said first resistor is connected to the noninverting input of said first operational amplifier, the junction between said two resistors forming said series resistors is connected to the noninverting input of said second operational amplifier and to the inverting input of said first operational amplifier and wherein the output of said second operational amplifier is connected to the inverting input of said second operational amplifier as well as to said third resistor.

25. The amplifier system claimed in claim 24 wherein said second resistor is formed of two elements mounted on opposite sides of said first resistor and said third resistor is formed of two elements mounted on opposite sides of said second resistor.

26. An AC resistor attenuator with low parasitic capacitance coupling to surrounding items and, thus, substantially constant attenuation over a relatively wide frequency range, said AC resistor attenuator comprising:
a first resistor;
a second resistor substantially entirely surrounding said first resistor for reducing parasitic capacitance coupling to said first resistor;
said first and second resistors being thermally matched and having substantially identical resistance profiles;
electrical connecting means for connecting said first and second resistors in series;
input terminal means connected to one end of said series connected first and second resistors;
output terminal means connected to the junction between said series connected first and second resistors; and
common terminal means connected to the other end of said series connected first and second resistors, wherein said first resistor comprises a first coil of elongate resistive material; said second resistor comprises a second coil of elongate resistive material having a diameter larger than the first coil of elongate resistive material; and said first and second coils of elongate resistive material are coaxially oriented.

27. An AC resistor attenuator with low parasitic capacitance coupling to surrounding items and, thus, substantially constant attenuation over a relatively wide frequency range, said AC resistor attenuator comprising:
a first resistor;
a second resistor substantially entirely surrounding said first resistor for reducing parasitic capacitance coupling to said first resistor;
said first and second resistors being thermally matched and having substantially identical resistance profiles;
electrical connecting means for connecting said first and second resistors in series;
input terminal means connected to one end of said series connected first and second resistors;
output terminal means connected to the junction between said series connected first and second resistors; and
common terminal means connected to the other end of said series connected first and second resistors, including a third resistor substantially entirely surrounding said second resistor, said third resistor thermally matching said first and second resistors and having a resistance profile substantially identical to said first and second resistors.

28. An AC resistor attenuator as claimed in claim 27 wherein:
said second resistor comprises first and second elements, said elements mounted on opposite sides of said first resistor; and,
said third resistor comprises first and second elements, said elements mounted on opposite sides of said second resistor.

* * * * *